(12) United States Patent
Sinha et al.

(10) Patent No.: US 9,846,747 B2
(45) Date of Patent: Dec. 19, 2017

(54) SYSTEM AND METHOD OF DATA COMPRESSION

(71) Applicant: Tata Consultancy Services Limited, Mumbai (IN)

(72) Inventors: Rahul Sinha, Bangalore (IN); Balamuralidhar Purushothaman, Bangalore (IN); Tapas Chakravarty, Kolkata (IN); Arijit Chowdhury, Kolkata (IN)

(73) Assignee: Tata Consultancy Services Limited, Mumbai (IN)

( * ) Notice: Subject to any disclaimer, the term of this patent is extended or adjusted under 35 U.S.C. 154(b) by 389 days.

(21) Appl. No.: 14/561,520

(22) Filed: Dec. 5, 2014

(65) Prior Publication Data

US 2015/0193545 A1    Jul. 9, 2015

(30) Foreign Application Priority Data

Jan. 8, 2014   (IN) .............................. 68/MUM/2014

(51) Int. Cl.
 *G06F 17/30* (2006.01)
 *H03M 7/30* (2006.01)

(52) U.S. Cl.
 CPC .. *G06F 17/30867* (2013.01); *G06F 17/30616* (2013.01); *H03M 7/30* (2013.01);
 (Continued)

(58) Field of Classification Search
 CPC ........ G06F 17/30867; G06F 17/30616; H03M 7/3082; H03M 7/30; H03M 7/3059; G05B 2219/33249
 See application file for complete search history.

(56) References Cited

U.S. PATENT DOCUMENTS 5,319,682 A    6/1994   Clark
6,957,147 B2  10/2005   Baliguet et al.
(Continued)

FOREIGN PATENT DOCUMENTS

WO    WO 02/33558 A1    4/2002

OTHER PUBLICATIONS

C. Varadharajan, "A Wavelet-Based System for Event Detection in Online Real-time Sensor Data", Feb. 2004.
(Continued)

*Primary Examiner* — Jorge A Casanova
(74) *Attorney, Agent, or Firm* — Finnegan, Henderson, Farabow, Garrett & Dunner LLP (57) ABSTRACT

This disclosure relates to systems and methods for adaptively compressing data based on compression parameters. In one embodiment, a method for compressing a dataset is disclosed, including filtering a dataset based on occurrence of an event, and determining a quality of information index indicating a measure of quality of the dataset based on a quality of information estimation function. The method may include comparing the quality of information index with a list of indices stored in a lookup table to identify a target quality of information index and corresponding compression parameters, wherein the target quality of information index is indicative of a reference measure of quality of the dataset applicable for deriving statistical inferences based on analysis of the dataset. Also, the method may include inputting the compression parameters in a compression algorithm for compressing the dataset to achieve the target quality of information index for the analysis.

16 Claims, 4 Drawing Sheets

(52) U.S. Cl.
CPC ....... *H03M 7/3059* (2013.01); *H03M 7/3082* (2013.01); *G05B 2219/33249* (2013.01)

(56) References Cited

U.S. PATENT DOCUMENTS

2011/0286525 A1* 11/2011 Kamisli ............... H04N 19/176
375/240.16
2013/0336594 A1* 12/2013 Dorairaj ............... H04N 19/126
382/250

OTHER PUBLICATIONS

D. Lee et al., "Adaptive and Energy Efficient Wavelet Image Compression for Mobile Multimedia Data Services", Department of Electrical and Computer Engineering.

* cited by examiner

SYSTEM AND METHOD OF DATA COMPRESSION

PRIORITY CLAIM

This U.S. patent application claims the benefit of priority under 35 U.S.C. §119 to India patent application no. 68/MUM/2014, filed on Jan. 8, 2014. The aforementioned application is incorporated herein by reference in its entirety.

TECHNICAL FIELD

The present subject matter described herein, in general, relates to data compressing, and more particularly to a system and method for adaptively compressing data based on compression parameters.

BACKGROUND

With an advent of various embedded systems and communication infrastructure, a cyber-physical system may be monitored in real-time based on data captured from one or more sensors. Based on the capturing of the data, it has been observed that the data may be analyzed on-the-fly or the data may be transmitted to a server for real-time monitoring or deriving statistical inference from the data.

For example, insurance companies may use a telematics application for real-time monitoring of a driving pattern of a driver driving a vehicle. The driving pattern may be monitored in the real-time based on transmission of the data, captured by the one or more sensors deployed on the vehicle, to the server that may be associated to the insurance companies. In one aspect, the one or more sensors (such as accelerometer sensor, tachometer) may facilitate capturing of the data associated to the vehicle in transit. The data captured may further be transmitted to the server over a telecommunication network for the real-time monitoring of the driving pattern of the driver by analyzing the data.

In order to analyze the data for deriving the statistical inferences, the telematics application may require a large set of the data. For example, when a vehicle undertakes long duration trips like cross-country travels, the large set of the data may be transmitted over the telecommunication network for analysis. The transmission of the large set of the data may lead to incur high costs. In addition, the transmission of the large set of the data may further require high transmission bandwidth of the telecommunication network and data storage for storing the large set of the data.

In view of the above, there exists a challenge to transmit the data within the constraints of the transmission bandwidth and the data storage. Further, there exists a challenge related to quality of the data that may be impacted after compressing the data using data compression techniques. Data compression may impact the quality of the data, thereby resulting in major inaccuracies while deriving the statistical inference based on the analysis performed on the data.

SUMMARY

Before the present systems and methods, are described, it is to be understood that this application is not limited to the particular systems, and methodologies described, as there can be multiple possible embodiments which are not expressly illustrated in the present disclosures. It is also to be understood that the terminology used in the description is for the purpose of describing the particular versions or embodiments only, and is not intended to limit the scope of the present application. This summary is provided to introduce aspects related to systems and methods for compressing a dataset of a plurality of datasets captured from one or more sensors and the aspects are further described below in the detailed description. This summary is not intended to identify essential features of the claimed subject matter nor is it intended for use in determining or limiting the scope of the claimed subject matter.

In one embodiment, a system for compressing a dataset of a plurality of datasets captured from one or more sensors is disclosed. The system may comprise a hardware processor; and a memory coupled to the processor, wherein the processor is capable of executing instructions stored in the memory to perform a method. The method may comprise filtering, via one or more hardware processors, a dataset from a plurality of datasets based on occurrence of an event. Further, the method may comprise determining, via the one or more hardware processors, a quality of information index for the dataset, wherein the quality of information index indicates a measure of quality of the dataset, wherein the quality of information index is determined based on a quality of information estimation function. Also, the method may comprise comparing, via the one or more hardware processors, the quality of information index with a list of quality of information indices stored in a lookup table in order to identify a target quality of information index and compression parameters corresponding to the quality of information index, wherein the target quality of information index is indicative of a reference measure of quality of the dataset, and wherein the reference measure is applicable for deriving statistical inferences based on analysis performed on the dataset. Further, the method may comprise inputting, via the one or more hardware processors, the compression parameters in a compression algorithm for compressing the dataset in order to achieve the target quality of information index for the analysis.

In one embodiment, a method for compressing a dataset of a plurality of datasets captured from one or more sensors is disclosed. The method may comprise filtering, via one or more hardware processors, a dataset from a plurality of datasets based on occurrence of an event. Further, the method may comprise determining, via the one or more hardware processors, a quality of information index for the dataset, wherein the quality of information index indicates a measure of quality of the dataset, wherein the quality of information index is determined based on a quality of information estimation function. Also, the method may comprise comparing, via the one or more hardware processors, the quality of information index with a list of quality of information indices stored in a lookup table in order to identify a target quality of information index and compression parameters corresponding to the quality of information index, wherein the target quality of information index is indicative of a reference measure of quality of the dataset, and wherein the reference measure is applicable for deriving statistical inferences based on analysis performed on the dataset. Further, the method may comprise inputting, via the one or more hardware processors, the compression parameters in a compression algorithm for compressing the dataset in order to achieve the target quality of information index for the analysis.

In one embodiment, a non-transitory computer program product is disclosed, having embodied thereon computer-executable instructions for compressing a dataset of a plurality of datasets captured from one or more sensors. The instructions may comprise instructions for performing a method. The method may comprise filtering, via one or more hardware processors, a dataset from a plurality of datasets based on occurrence of an event. Further, the method may comprise determining, via the one or more hardware processors, a quality of information index for the dataset, wherein the quality of information index indicates a measure of quality of the dataset, wherein the quality of information index is determined based on a quality of information estimation function. Also, the method may comprise comparing, via the one or more hardware processors, the quality of information index with a list of quality of information indices stored in a lookup table in order to identify a target quality of information index and compression parameters corresponding to the quality of information index, wherein the target quality of information index is indicative of a reference measure of quality of the dataset, and wherein the reference measure is applicable for deriving statistical inferences based on analysis performed on the dataset. Further, the method may comprise inputting, via the one or more hardware processors, the compression parameters in a compression algorithm for compressing the dataset in order to achieve the target quality of information index for the analysis.

BRIEF DESCRIPTION OF THE DRAWINGS

The foregoing detailed description of embodiments is better understood when read in conjunction with the appended drawings. For the purpose of illustrating the disclosure, there is shown in the present document example constructions of the disclosure; however, the disclosure is not limited to the specific methods and apparatus disclosed in the document and the drawings.

The detailed description is described with reference to the accompanying figures. In the figures, the left-most digit(s) of a reference number identifies the figure in which the reference number first appears. The same numbers are used throughout the drawings to refer like features and components.

DETAILED DESCRIPTION

Some embodiments of this disclosure, illustrating all its features, will now be discussed in detail. The words "comprising," "having," "containing," and "including," and other forms thereof, are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise. Although any systems and methods similar or equivalent to those described herein can be used in the practice or testing of embodiments of the present disclosure, the exemplary, systems and methods are now described. The disclosed embodiments are merely exemplary of the disclosure, which may be embodied in various forms.

Various modifications to the embodiment will be readily apparent to those skilled in the art and the generic principles herein may be applied to other embodiments. However, one of ordinary skill in the art will readily recognize that the present disclosure is not intended to be limited to the embodiments illustrated, but is to be accorded the widest scope consistent with the principles and features described herein.

The present subject matter provides systems and methods for compressing a dataset of a plurality of datasets captured from one or more sensors are described. The one or more sensors, associated to a telematics application, may generate the plurality of datasets. The systems and the methods may detect an event to filter the dataset from the plurality of datasets based on detection of a pre-defined threshold value stored in a database, wherein the pre-defined threshold value may be associated to the event. In one aspect, the dataset may be filtered in order to derive statistical inferences by performing analysis on the dataset. In an embodiment, the dataset may be utilized by insurance companies in order to derive insurance premiums for various insurance products.

For example, the insurance companies may utilize the dataset to derive an insurance premium applicable for a driver, driving a vehicle, by using the telematics application. In order to derive the insurance premium, the telematics application may capture the plurality of datasets from the one or more sensors such as an accelerometer or a tachometer deployed on the vehicle. It may be understood that the insurance premium may be determined based on a risk score associated to the driver. The risk score may be determined based on occurrence of one or more events such as hard cornering, hard acceleration or hard deceleration of the vehicle driven by the driver. It may be understood that, the occurrence of the one or more events may be determined based on the detection of the pre-defined threshold value associated to the one or more events. On occurrence of the one or more events (the hard cornering, the hard acceleration or the hard deceleration), the dataset may be filtered from the plurality of datasets. Subsequent to the filtration, the dataset may be compressed in accordance with a target quality of information (QoI) index, such that the compression of the dataset may not impact on the quality of the dataset while deriving the statistical inferences. The target QoI may indicate a reference measure of quality of the dataset required for deriving the statistical inferences.

In order to compress the dataset in accordance with the target QoI, a quality of information (QoI) index for the dataset may be determined using a QoI estimation function. The QoI index may indicate a measure of quality of the dataset. In one aspect, after determining the QoI index, the QoI index may be compared with a list of QoI indices stored in a lookup table. In one aspect, the QoI index may be compared with the list of QoI indices in order to identify the target QoI index and compression parameters corresponding to the QoI index for the dataset. In one aspect, the lookup table may contain the list of QoI indices mapped with a list of target QoI indices and a list of compression parameters.

It may be understood that, the statistical inferences may be derived by performing the analysis on the dataset. The dataset may be compressed by using the compression parameter as identified. In one embodiment, the target QoI index may be identified from the list of target QoI indices stored in the lookup table. The compression parameters, on the other hand, may be identified from the list of compression parameters stored in the lookup table.

Subsequent to the identification of the target QoI index and the compression parameters, the compression parameters may be inputted into a compression algorithm. The compression parameters may facilitate in achieving the target QoI index on compressing the dataset using the compression algorithm. Examples of the compression algorithm may include, but not be limited to, lossless data compression, and a lossy compression. In this manner, based on the target QoI, the statistical inferences may be derived by performing the analysis on the dataset. Subsequent to the compression of the dataset, the dataset may then be transmitted to a centralized server associated to the insurance companies in order to derive the statistical inferences such as the insurance premium applicable for the driver driving the vehicle.

While aspects of described system and method for compressing a dataset of a plurality of datasets captured from one or more sensors may be implemented in any number of different computing systems, environments, and/or configurations, the embodiments are described in the context of the following exemplary system.

Figure 1:
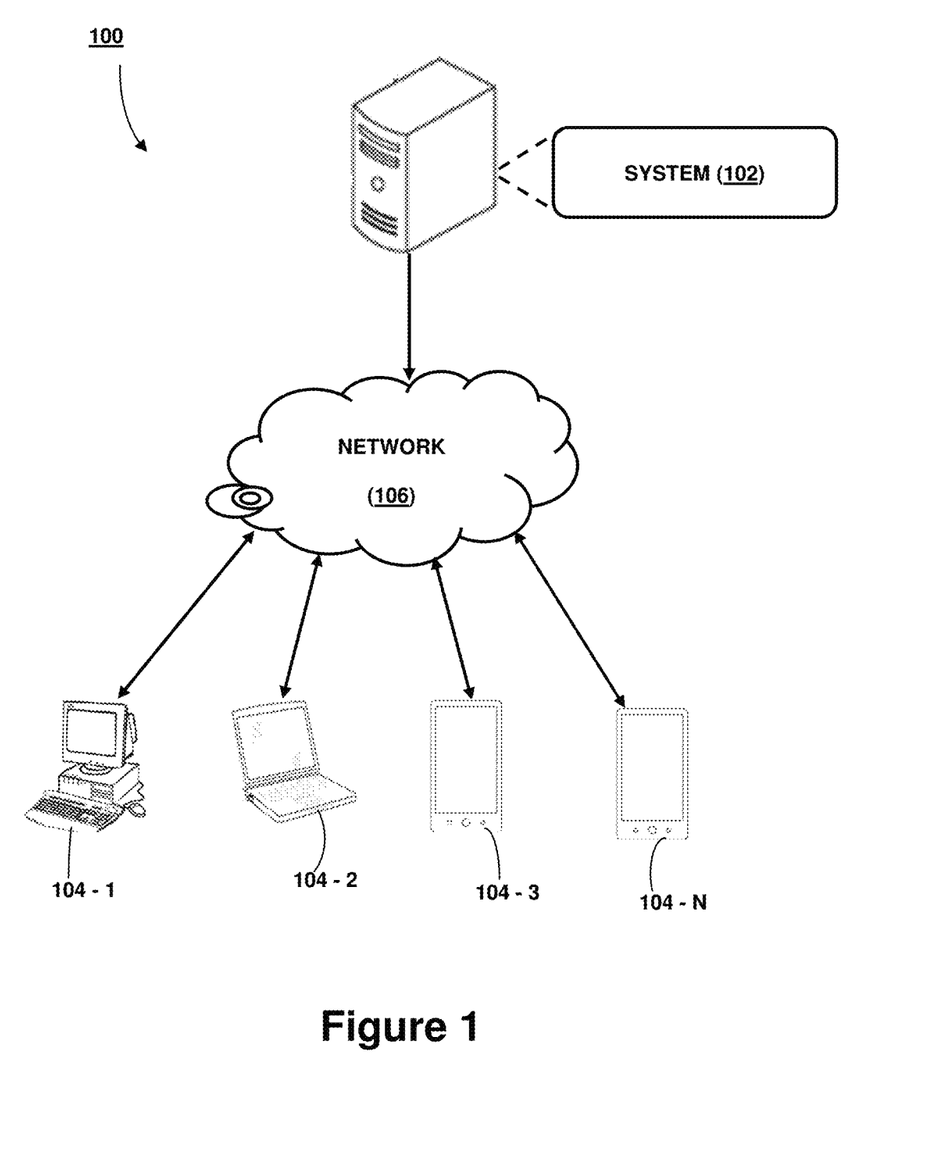
FIG. 1 illustrates a network implementation of a system for compressing a dataset of a plurality of datasets captured from one or more sensors is shown, in accordance with an embodiment of the present subject matter.

Referring now to FIG. 1, a network implementation 100 of a system 102 for compressing a dataset of a plurality of datasets captured from one or more sensors is illustrated, in accordance with an embodiment of the present subject matter. In one embodiment, the system 102 may filter the dataset from the plurality of datasets based on an occurrence of an event. Upon filtering the dataset, the system 102 may determine a quality of information (QoI) index for the dataset, wherein the QoI index may indicate a measure of quality of the dataset. Subsequent to the determination of the QoI index, the system 102 may compare the QoI index with a list of QoI indices stored in a lookup table. In one aspect, the system 102 may compare the QoI index with the list of QoI indices for identifying a target QoI index and compression parameters corresponding to the QoI index. Based on the identification, the system 102 may input the compression parameters in a compression algorithm for compressing the dataset in order to achieve the target QoI index for the analysis.

Although the present subject matter is explained considering that the system 102 is implemented on a server, it may be understood that the system 102 may also be implemented in a variety of computing systems, such as a laptop computer, a desktop computer, a notebook, a workstation, a mainframe computer, a network server, and the like. In one implementation, the system 102 may be implemented in a cloud-based environment. It will be understood that the system 102 may be accessed by multiple users through one or more user devices 104-1, 104-2 . . . 104-N, collectively referred to as user devices 104 hereinafter, or applications residing on the user devices 104. Examples of the user devices 104 may include, but are not limited to, a portable computer, a personal digital assistant, a handheld device, and a workstation. The user devices 104 are communicatively coupled to the system 102 through a network 106.

In one implementation, the network 106 may be a wireless network, a wired network or a combination thereof. The network 106 can be implemented as one of the different types of networks, such as intranet, local area network (LAN), wide area network (WAN), the internet, and the like. The network 106 may either be a dedicated network or a shared network. The shared network may represent an association of the different types of networks that can use a variety of protocols, for example, Hypertext Transfer Protocol (HTTP), Transmission Control Protocol/Internet Protocol (TCP/IP), Wireless Application Protocol (WAP), and the like, to communicate with one another. Further the network 106 may include a variety of network devices, including routers, bridges, servers, computing devices, storage devices, and the like.

Figure 2:
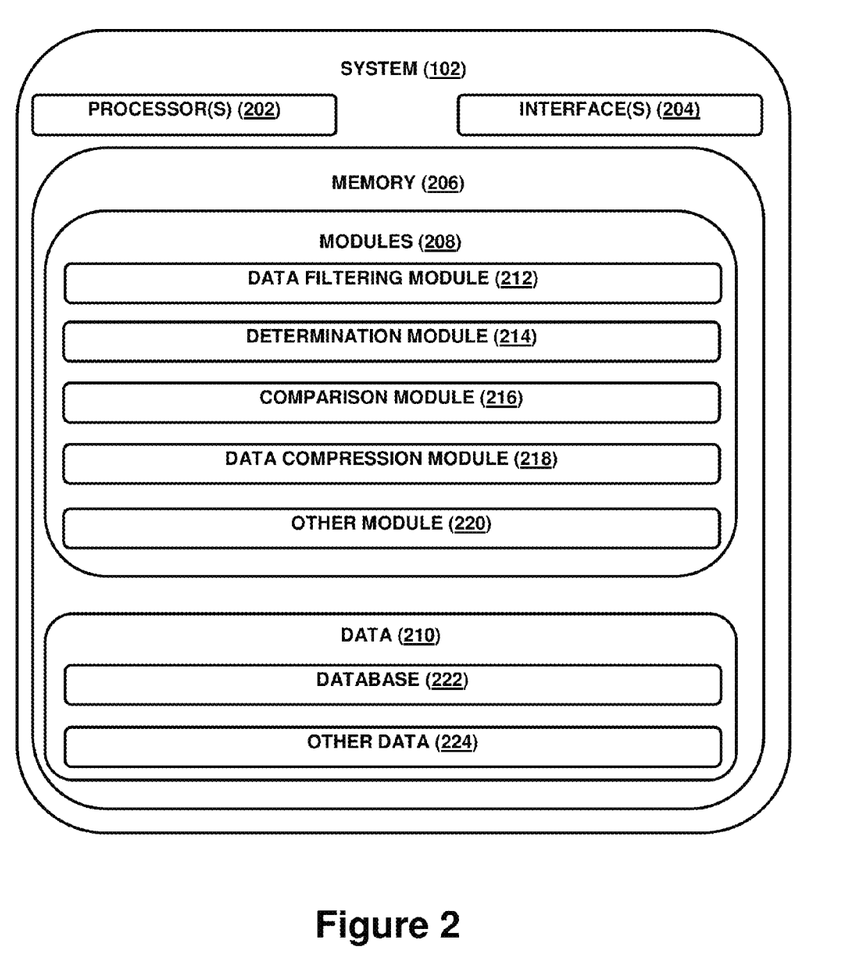
FIG. 2 illustrates the system, in accordance with an embodiment of the present subject matter.

Referring now to FIG. 2, the system 102 is illustrated in accordance with an embodiment of the present subject matter. In one embodiment, the system 102 may include at least one processor 202, an input/output (I/O) interface 204, and a memory 206. The at least one processor 202 may be implemented as one or more microprocessors, microcomputers, microcontrollers, digital signal processors, central processing units, state machines, logic circuitries, and/or any devices that manipulate signals based on operational instructions. Among other capabilities, the at least one processor 202 may be configured to fetch and execute computer-readable instructions stored in the memory 206.

The I/O interface 204 may include a variety of software and hardware interfaces, for example, a web interface, a graphical user interface, and the like. The I/O interface 204 may allow the system 102 to interact with a user directly or through the client devices 104. Further, the I/O interface 204 may enable the system 102 to communicate with other computing devices, such as web servers and external data servers (not shown). The I/O interface 204 can facilitate multiple communications within a wide variety of networks and protocol types, including wired networks, for example, LAN, cable, etc., and wireless networks, such as WLAN, cellular, or satellite. The I/O interface 204 may include one or more ports for connecting a number of devices to one another or to another server.

The memory 206 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. The memory 206 may include modules 208 and data 210.

The modules 208 may include routines, programs, objects, components, data structures, etc., which can perform particular tasks, functions or implement particular abstract data types. In one implementation, the modules 208 may include a data filtering module 212, a determination module 214, a comparison module 216, a data compression module 218, and other modules 220. The other modules 220 may include programs or coded instructions that supplement applications and functions of the system 102.

The data 210, amongst other things, serves as a repository for storing data processed, received, and generated by one or more of the modules 208. The data 210 may also include a database 222, and other data 224. The other data 224 may include data generated as a result of the execution of one or more modules in the other modules 220.

In one implementation, at first, a user may use the client device 104 to access the system 102 via the I/O interface 204. Users may register themselves using the I/O interface 204 in order to use the system 102. The working of the system 102 may be explained in detail in FIGS. 3 and 4 explained below. The system 102 may be used for compressing a dataset of a plurality of datasets captured from one or more sensors. In order to compress the dataset, the system 102, at first, filters the dataset from the plurality of sensors that may generate the plurality of datasets, wherein the one or more sensors that may be deployed on a vehicle. It may be understood that the dataset may filtered by the data filtering module 212 based on occurrence of an event.

Figure 3:
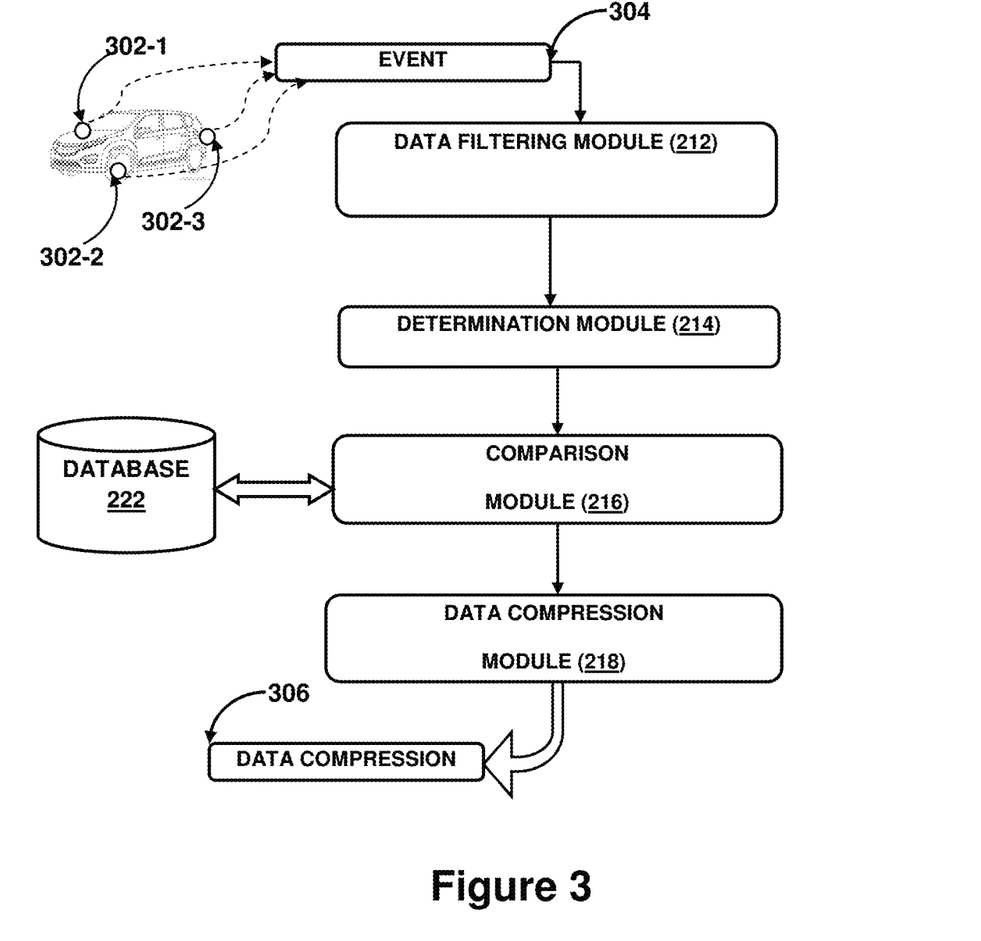
FIG. 3 illustrates the components of the system in accordance with an embodiment of the present subject matter.

Referring to FIG. 3, a detailed working of the components of the system 102 is illustrated, in accordance with an embodiment of the present subject matter. The system 102 may comprise a data filtering module 212, a determination module 214, a comparison module 216, and a data compression module 218. In one implementation, in order to filter the dataset from the plurality of datasets generated by the one or more sensors (302-1, 302-2, 302-2), hereinafter referred to as sensors 302, the data filtering module 212 may filter the dataset from the plurality of datasets based on occurrence of one or more event hereinafter referred to as event 304. The occurrence of the event 304 may be determined based on a detection of pre-defined threshold value stored in a database 222, wherein the pre-defined threshold value may be associated to the event 304. On occurrence of the event 304, the dataset may be filtered from the plurality of datasets in order to derive statistical inferences by performing analysis on the dataset.

In order to understand working of the filtering module 212 as described above, consider an example where the dataset may be filtered from the plurality of the datasets. The dataset may be utilized by insurance companies for computing an insurance premium applicable for the driver driving the vehicle. In one aspect, the insurance premium may be computed by using a telematics application. It may be understood that, for computing the insurance premium for the driver driving the vehicle using the telematics application, the sensors 304 (such as an accelerometer or a tachometer) may be deployed on the vehicle. As the driver is driving the vehicle, the plurality of datasets may be generated by the sensors 304, wherein the plurality of datasets indicates driving pattern of the driver. Subsequent to the generation of the plurality of datasets, the data filtering module 212 may filter the dataset from the plurality of datasets based on occurrence of the event 304, wherein the event 304 may be occurred on the detection of the pre-defined threshold value corresponding to the event 304. Examples of the event 304 corresponding to the telematics application for computing the insurance premium may include, but not limited to, a hard cornering, a hard acceleration or a hard deceleration.

In one embodiment, the event 304 may facilitate to determine a risk score associated to the driver of the vehicle. The risk score may be used by insurance companies to compute the insurance premium. In order to evaluate the risk score associated with a particular driving pattern of the driver, 3-axis acceleration may be continuously measured at 20 Hz sampling rate by using the sensors 302 such as the accelerometer. It may be understood that, the pre-defined threshold value, corresponding to the event 304 (i.e. the hard cornering, the hard acceleration or the hard deceleration), may be pre-defined in the database 222 for determining the risk score. In one aspect, the event 304 may be detected by applying the pre-defined threshold value on acceleration values, wherein the acceleration values may be determined by using the sensors 302 deployed on the vehicle. In one embodiment, the occurrence of the event 304 may be defined as follows:

In one example, the hard cornering may be related to lateral dynamics of the vehicle. It may be understood that, in terms of overturning limit for the vehicle in transit, the vehicle with mass 'M' is cornering with a lateral acceleration of '$a_x$ (m/sec2)'. Based on the lateral acceleration, maximum lateral acceleration is given by $$a_x^{max} = \mu \cdot g \quad (1)$$

where, $\mu$ is the coefficient of friction. In one aspect, if '$\mu$'=1, then the maximum lateral acceleration that may trigger the overturn the vehicle is:

$$a_x^{max} = g \quad (2)$$

It may be understood that, the "static stability factor" is greater than '1'. Thus, based on the above observation from the above equations (1) and (2), the overturn may be determined by coefficient of friction between road and the tires of the vehicle. In one aspect, the lateral acceleration values may be normalized with respect to 'g'. Such that, $$\text{Measured Cornering } MCT = \pm \frac{\text{measured lateral acceleration}}{g} \leq 1.0 \quad (3)$$

Based on the equations (3), the pre-defined threshold value for the hard cornering (MCT) values greater than 0.5 are recorded as the event 304.

In another example, the hard acceleration or the hard deceleration may be related to longitudinal dynamics of the vehicle. In one aspect, the limits for achieving longitudinal acceleration given by friction limits as well as the hazard of tilting may be determined by:

$$a_y^{max} = \mp \mu \cdot g \quad (4)$$

In one aspect, consider '$\mu$'=1, the limit for the longitudinal acceleration is given as $$\text{Measured acceleration: } MAT = \pm \frac{\text{Measured longitudal acceleration/deceleration}}{g} \quad (5)$$

with maximum value as '1'. In one embodiment, the pre-defined threshold value for the MCT and the MAT is '0.5 g'. It may be understood that, whenever, the acceleration, determined from the sensors 302, is greater than the '0.5 g', such dataset may be considered as relevant and thereby filtered from the plurality of datasets by the filtering module 212. The dataset may be then transmitted to a centralized server of the insurance companies in order to derive the statistical inferences, based on the risk score, such as the insurance premium applicable for the driver driving the vehicle.

It may be understood that, the dataset transmitted to the centralized server should be compressed in accordance with a target quality of information (QoI) index, such that the compression of the dataset may not impact on the quality of the dataset while deriving the statistical inferences. In one embodiment, in order to compress the dataset in accordance with the target QoI, the determination module 214 may determine a quality of information (QoI) index for the dataset. The QoI index may indicate a measure of quality of the dataset. It may be understood that, the QoI index may be determined based on a QoI estimation function. In one embodiment, the QoI estimation function may be defined as follows:

$$QoI = \sum_i w_i f_i[a(z)] \quad (6)$$

where the 'i' indicates the dataset of the plurality of datasets for which the QoI is to be determined, '$w_i$' indicates weight that are chosen to normalize the QoI and '$f_i[a(z)]$' may be computed to derive an indicator of the rate of change of the measured acceleration of the vehicle. Now in order to understand the determination of the QoI using the equation (6), consider an application where long-term reliability of suspension is to be measured. In one aspect, the long-term reliability of the suspension may be measured by computing $QoI_{jerk\ energy}$, on the vehicle from the measured vertical acceleration '$f_i[a(z)]$'.

In one embodiment, $$QoI = \sum_i w_i f_i[a(z)] \quad (7)$$

where $f_i[a(z)] = J_{si}^2$, wherein '$J_{si}^2$' indicates 'jerk energy'. In one aspect, the Jerk energy may be defined as below:

Consider, '$a_1$', '$a_2$', ..., '$a_n$' be the measured acceleration samples of the vehicle at time '$t_1$', '$t_2$', ..., '$t_n$' where $\Delta t = t_n - t_{n-1}$ for uniform sampling rate.

Based on the above description, the 'jerk energy' may be defined as $$J_{si} = \frac{a_{i+1} - a_i}{\Delta t} \text{ for } (1 \leq i \leq n-1) \quad (8)$$

where 'n' indicates total number of the measured acceleration samples. Based on the equation (7), the 'QoI' for the total number of the measured acceleration samples may be determined by:

$$QoI = w_1 J_{s1}^2 + w_2 J_{s2}^2 + \ldots + w_{19} J_{s19}^2 \quad (9)$$

In one aspect, the weight ($w_1, w_2, \ldots, w_{19}$) associated to each dataset, as illustrated in equation 9, may be normalized by performing at least one arithmetic/mathematical operation in such a manner that the QoI is within the range of 0 to 1. It may be understood that, 's' indicates the time-window of '1 sec' (therefore 20 samples of the measured acceleration is captured). In one aspect, if the 'jerk energy' $J_{s1}^2 = 1500\ m^2/s^6$ as extreme value, towards damage to the suspension of the vehicle, then the 'jerk energy' sequence $\{J_{s1}^2, J_{s2}^2, \ldots, J_{s19}^2\}$ may be normalized with respect to 1500 $m^2/s^6$, the $QoI_{jerk\ energy}$ may be determined by using the equation (7). Similarly $QoI_{hard\ acceleration}$ index, $QoI_{hard\ acceleration}$ index and $QoI_{hard\ cornering}$ index may also be determined by using the equation (7).

Based on the determination of the QoI index, the comparison module 216 may compare the QoI index with a list of QoI indices stored in a lookup table. The lookup table may contain the list of QoI indices mapped with a list of target QoI indices and a list of compression parameters. In order to identify the target QoI index and compression parameters for the dataset, the comparison module 216 may compare the QoI index with the list of QoI indices stored in the database 222. The target QoI index may indicate a reference measure of quality of the dataset for deriving the statistical inferences based on analysis performed on the dataset compressed by using the compression parameters. In one embodiment, the target QoI index may be identified from the list of target QoI indices. The compression parameters, on the other hand, may be identified from the list of compression parameters. It may be understood that, the list of target QoI indices and the compression parameters are stored in the look-up table located in the database 222.

Based on the identification of the target QoI index and the compression parameters corresponding to the dataset, the data compression module 218 may input the compression parameters in a compression algorithm. Examples of the compression parameters may include wavelet transform, a threshold on number of transform coefficients and quantizer decision boundaries. Examples of the compression algorithm may include lossy compression based on Huffman encoding of wavelet transform coefficients computed for the dataset. In one embodiment, in order to compress the dataset, the lossy compression may comprise computation of the transform coefficients of the dataset by using at least one transformation technique. Examples of the at least one transformation technique may include the wavelet transform, a discrete cosine transform, or Fourier transform. Subsequent to the computation of the transform coefficients, the threshold on the number of the transform coefficients and quantization of the transform coefficients may be performed using conventional quantizers in order to minimize the distortion. Examples of the conventional quantizers may include, but not be limited to, scalar quantizer or vector quantizer. After quantizing the transform coefficients, the transform coefficients may then be encoded by using lossless encoding techniques. Examples of the lossless encoding techniques may include Huffman encoding or arithmetic coding.

In one embodiment, the compression parameters may be used to compress the dataset when the QoI index is less than the target QoI index. It may be understood that, the compression parameters may compress the dataset based on following factors:

When the $QoI_{hard\ acceleration}$ index$>$target$_{hard\ acceleration\ index}$ the $QoI_{hard\ acceleration}$ index$>$target$_{hard\ deceleration}$ index and the $QoI_{hard\ cornering}$ index$>$target$_{hard\ cornering}$ index, then the compression parameters, i.e., the scale of wavelet transform, the threshold value for selecting transform coefficients and the quantization size, may be identified from the lookup table corresponding to the $QoI_{hard\ acceleration}$ index, the $QoI_{hard\ acceleration}$ index and the $QoI_{hard\ cornering}$ index respectively. On the other hand, when the $QoI_{hard\ acceleration}$ index$<$the target$_{hard\ acceleration}$ index, the $QoI_{hard\ acceleration}$ index$<$the target$_{hard\ deceleration}$ index and the $QoI_{hard\ cornering}$ index$<$the target$_{hard\ cornering}$ index, then the dataset may either not compressed or may be compressed by using default compression parameters. The default compression parameters may indicate that the dataset may be compressed by using pre-defined compression parameters.

In one embodiment, upon compressing the dataset in accordance with the target QoI index, the dataset may then be transmitted to the centralized server, such that the compression of the dataset may not impact on the quality of the dataset while deriving the statistical inferences.

Exemplary embodiments discussed above may provide certain advantages. Though not required to practice aspects of the disclosure, these advantages may include those provided by the following features.

Some embodiments can enable a system and a method for filtering a dataset from a plurality of datasets based on occurrence of an event in order to optimize storage capacity of a data storage medium that may have limited capacity.

Some embodiments can enable the system and the method for measuring of quality of information (QoI) as applicable on the dataset for end objective and tying up such measure to re-configurability of the data compression algorithm.

Figure 4:
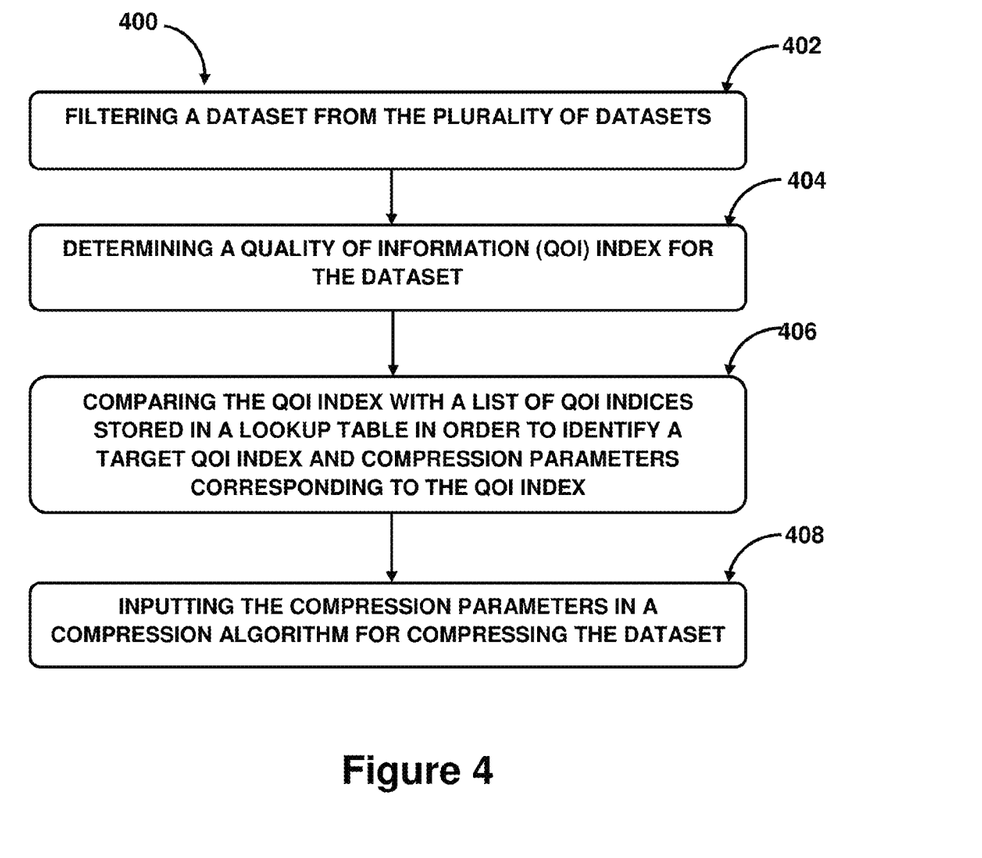
FIG. 4 illustrates a method for compressing the dataset of the plurality of datasets captured from the one or more sensors, in accordance with an embodiment of the present subject matter.

Referring now to FIG. 4, a method 400 for compressing a dataset of a plurality of datasets captured from one or more sensors is shown, in accordance with an embodiment of the present subject matter. The method 400 may be described in the general context of computer executable instructions. Generally, computer executable instructions can include routines, programs, objects, components, data structures, procedures, modules, functions, etc., that perform particular functions or implement particular abstract data types. The method 400 may also be practiced in a distributed computing environment where functions are performed by remote processing devices that are linked through a communications network. In a distributed computing environment, computer executable instructions may be located in both local and remote computer storage media, including memory storage devices.

The order in which the method 400 is described is not intended to be construed as a limitation, and any number of the described method blocks can be combined in any order to implement the method 400 or alternate methods. Additionally, individual blocks may be deleted from the method 400 without departing from the spirit and scope of the subject matter described herein. Furthermore, the method can be implemented in any suitable hardware, software, firmware, or combination thereof. However, for ease of explanation, in the embodiments described below, the method 400 may be considered to be implemented in the above described system 102.

At block 402, the dataset may be filtered from the plurality of datasets on occurrence of an event. In one implementation, the dataset may be filtered by the data filtering module 212.

At block 404, a quality of information (QoI) index for the dataset may be determined based on a QoI estimation function. In one aspect, the QoI index may indicate a measure of quality of the dataset. In one implementation, the QoI index may be determined by the determination module 214.

At block 406, the QoI index may be compared with a list of QoI indices stored in a lookup table. In one aspect, the QoI index may be compared with a list of QoI indices for identifying a target QoI index and compression parameters corresponding to the QoI index. The target QoI index may be indicative of a reference measure of quality of the dataset applicable for deriving statistical inferences based on analysis performed on the dataset. In one implementation, the target QoI index and the compression parameters may be identified by the comparison module 216.

At block 408, the compression parameters may be inputted in a compression algorithm. In one aspect, the compression parameters may be inputted for compressing the dataset in order to achieve the target QoI index for the analysis. In one implementation, the compression parameters may be inputted by the data compression module 218.

Although implementations for methods and systems for compressing the dataset of the plurality of datasets captured from the one or more sensors have been described in language specific to structural features and/or methods, it is to be understood that the appended claims are not necessarily limited to the specific features or methods described. Rather, the specific features and methods are disclosed as examples of implementations for compressing the dataset of the plurality of datasets captured from the one or more sensors.

We claim:

1. A method for compressing a dataset of a plurality of datasets captured from one or more sensors, the method comprising:

filtering, via one or more hardware processors, a dataset from the plurality of datasets based on an occurrence of an event;

determining, via the one or more hardware processors, a quality of information index for the dataset, wherein the quality of information index indicates a measure of quality of the dataset, wherein the quality of information index is determined based on a quality of information estimation function;

comparing, via the one or more hardware processors, the quality of information index with a list of quality of information indices stored in a lookup table in order to identify a target quality of information index and compression parameters corresponding to the quality of information index, and wherein the target quality of information index is indicative of a reference measure of quality of the dataset, and wherein the reference measure is applicable for deriving statistical inferences based on analysis performed on the dataset, wherein the compression parameters comprises a scale of wavelet transform, a threshold on the number of transform coefficients, one or more quantizer decision boundaries and one or more representation levels; and inputting, via the one or more hardware processors, the compression parameters in a compression algorithm for compressing the dataset in order to achieve the target quality of information index for the analysis, wherein the compression parameters are used to compress the dataset when the quality of information index is greater than the target quality of information index.

2. The method of claim 1, wherein the event includes least one of: a hard cornering, hard acceleration, hard deceleration.

3. The method of claim 1, wherein the quality of information estimation function is $QoI = \Sigma w_i\, f_i\, [a(z)]$, wherein $w_i$ indicates weight that are chosen to normalize the QoI, and wherein $f_i\, [a(z)]$ is an indicator of the rate of change of acceleration of a vehicle.

4. The method of claim 1, wherein the lookup table contains the list of quality of information indices mapped with a list of target quality of information indices and a list of compression parameters.

5. The method of claim 4, wherein the target quality of information index is identified from the list of target quality of information indices, and wherein the compression parameters are identified from the list of compression parameters, and wherein the list of target quality of information indices and the list of compression parameters are stored in the look-up table.

6. The method of claim 1, wherein the compression algorithm for compressing the dataset includes at least one of: a lossy compression or a lossless compression.

7. A system for compressing a dataset of a plurality of datasets captured from one or more sensors, the system comprising:

a processor; and a memory coupled to the processor, wherein the processor is capable of executing instructions stored in the memory for:

filtering a dataset from a plurality of datasets based on occurrence of an event;

determining a quality of information index for the dataset, wherein the quality of information index indicates a measure of quality of the dataset, wherein the quality of information index is determined based on a quality of information estimation function;

comparing the quality of information index with a list of quality of information indices stored in a lookup table in order to identify a target quality of information index and compression parameters corresponding to the quality of information index, wherein the target quality of information index is indicative of a reference measure of quality of the dataset, and wherein the reference measure is applicable for deriving statistical inferences based on the analysis performed on the dataset, wherein the compression parameters comprises a scale of wavelet transform, a threshold on the number of transform coefficients, one or more quantizer decision boundaries and one or more representation levels; and inputting the compression parameters in a compression algorithm for compressing the dataset in order to achieve the target quality of information index for the analysis, wherein the compression parameters are used to compress the dataset when the quality of information index is greater than the target quality of information index.

8. The system of claim 7, wherein the event includes at least one of: hard cornering, hard acceleration, or hard deceleration.

9. The system of claim 7, wherein the quality of information estimation function is $QoI = \Sigma w_i f_i [a(z)]$, wherein $w_i$ indicates weights chosen to normalize the quality of information index, and wherein $f_i [a(z)]$ is an indicator of a rate of change of acceleration of a vehicle.

10. The system of claim 7, wherein the lookup table includes the list of the quality of information indices mapped with a list of target quality of information indices and a list of compression parameters.

11. The system of claim 10, wherein the target quality of information index is identified from the list of target quality of information indices, and wherein the compression parameters are identified from the list of compression parameters, and wherein the list of target quality of information indices and the list of compression parameters are stored in the look-up table.

12. A non-transitory computer program product having embodied thereon computer-executable instructions for compressing a dataset of a plurality of datasets captured from one or more sensors, the instructions comprising instructions for:

filtering a dataset from a plurality of datasets based on occurrence of an event;

determining a quality of information index for the dataset, wherein the quality of information index indicates a measure of the quality of the dataset, wherein the quality of information index is determined based on a quality of estimation function;

comparing the quality of information index with a list of quality of information indices stored in a lookup table in order to identify a target quality of information index and compression parameters corresponding to the quality of information index, wherein the target quality of information index is indicative of a reference measure of quality of the dataset, and wherein the reference measure is applicable for deriving statistical inferences based on analysis performed on the dataset, wherein the compression parameters comprises a scale of wavelet transform, a threshold on the number of transform coefficients, one or more quantizer decision boundaries and one or more representation levels; and inputting the compression parameters in a compression algorithm for compressing the dataset in order to achieve the target quality of information index for the analysis, wherein the compression parameters are used to compress the dataset when the quality of information index is greater than the target quality of information index.

13. The computer program product of claim 12, wherein the event includes at least one of: hard cornering, hard acceleration, or hard deceleration.

14. The computer program product of claim 12, wherein the quality of information estimation function is $QoI = \Sigma w_i f_i [a(z)]$, wherein $w_i$ indicates weights chosen to normalize the quality of information index, and wherein $f_i [a(z)]$ is an indicator of a rate of change of acceleration of a vehicle.

15. The computer program product of claim 12, wherein the lookup table includes the list of quality of information indices mapped with a list of target quality of information indices and a list of compression parameters.

16. The computer program product of claim 15, wherein the target quality of information index is identified from the list of target quality of information indices, and wherein the compression parameters are identified from the list of compression parameters, and wherein the list of target quality of information indices and the list of compression parameters are stored in the look-up table.

* * * * *